United States Patent
Morimoto et al.

(10) Patent No.: US 7,358,147 B2
(45) Date of Patent: Apr. 15, 2008

(54) PROCESS FOR PRODUCING SOI WAFER

(75) Inventors: Nobuyuki Morimoto, Tokyo (JP); Hideki Nishihata, Tokyo (JP)

(73) Assignee: Sumco Corporation, Tokyo (JP)

(*) Notice: Subject to any disclaimer, the term of this patent is extended or adjusted under 35 U.S.C. 154(b) by 0 days.

(21) Appl. No.: 10/585,522

(22) PCT Filed: Dec. 28, 2004

(86) PCT No.: PCT/JP2004/019596
§ 371 (c)(1),
(2), (4) Date: Jul. 7, 2006

(87) PCT Pub. No.: WO2005/067053
PCT Pub. Date: Jul. 21, 2005

(65) Prior Publication Data
US 2007/0190737 A1  Aug. 16, 2007

(30) Foreign Application Priority Data
Jan. 8, 2004  (JP) ............................. 2004-003347

(51) Int. Cl.
*H01L 21/76* (2006.01)
(52) U.S. Cl. ............................ 438/406; 257/E21.346; 257/E21.339; 438/455
(58) Field of Classification Search ................ 438/455; 257/E21.346, E21.339, E21.568
See application file for complete search history.

(56) References Cited

U.S. PATENT DOCUMENTS 6,884,694 B2 * 4/2005 Park et al. .................. 438/455

(Continued)

FOREIGN PATENT DOCUMENTS

JP  11-02848  4/1999

(Continued)

OTHER PUBLICATIONS

International Search Report for PCT/JP2004/019596 dated Apr. 12, 2005.

(Continued)

*Primary Examiner*—Michael Lebentritt
*Assistant Examiner*—Thu-Huong Dinh
(74) *Attorney, Agent, or Firm*—Kolisch Hartwell, P.C.

(57) ABSTRACT

There is provided a process for producing an SOI wafer in which, when producing an SOI wafer using Smart Cut technology, the surface can be smoothed after cleaving, the thickness of the SOI layer can be reduced, and the film thickness of the SOI wafer can be made uniform. In this process for producing an SOI wafer, hydrogen gas ions are implanted via an oxide film in a silicon wafer that is to be used for an active layer, so that an ion implanted layer is formed in the silicon bulk. Next, this active layer silicon wafer is bonded via an insulating film to a base wafer. By heating this base wafer, a portion thereof can be cleaved using the ion implanted layer as a boundary, thereby forming an SOI wafer. After the cleaving has been performed using the ion implanted layer as a boundary, the SOI wafer undergoes oxidization processing in an oxidizing atmosphere. This oxide film is then removed by, for example, HF solution. Thereafter, the SOI wafer undergoes heat processing for approximately three hours in an argon gas atmosphere at 1100° C. or more. As a result, the root mean square roughness of the SOI wafer surface is improved to 0.1 nm or less.

4 Claims, 2 Drawing Sheets

U.S. PATENT DOCUMENTS

| | | |
|---|---|---|
| 7,179,719 B2 * | 2/2007 | Droes et al. ............ 438/458 |
| 7,183,179 B2 * | 2/2007 | Droes et al. ............ 438/473 |
| 2003/0181001 A1 | 9/2003 | Aga et al. |
| 2004/0161948 A1 | 8/2004 | Maleville et al. |
| 2006/0177991 A1 * | 8/2006 | Murakami et al. ........ 438/455 |
| 2007/0069335 A1 * | 3/2007 | Endo et al. ............ 257/618 |

FOREIGN PATENT DOCUMENTS

| | | |
|---|---|---|
| JP | 2000-124092 | 4/2000 |
| JP | 2003-224247 | 1/2002 |
| WO | WO 03/005434 | 1/2003 |
| WO | WO 03/009366 | 1/2003 |
| WO | WO 03/009386 | 1/2003 |

OTHER PUBLICATIONS

Written Opinion for PCT/JP2004/019596 dated Apr. 12, 2005.

Transmittal Letter (date-of-receipt Jun. 11, 2007), and Communication and Supplementary European Search Report issued Jun. 5, 2007 in connection with European Patent Application No. 04807951.1.

* cited by examiner

PROCESS FOR PRODUCING SOI WAFER

TECHNICAL FIELD

The present invention relates to a process for producing a silicon-on-insulator (SOI) wafer and specifically to a process for producing an SOI wafer in which the surface of the SOI wafer is smoothed.

Priority is claimed on Japanese Patent Application No. 2004-3347, filed Jan. 8, 2004, the content of which is incorporated herein by reference.

BACKGROUND ART

Compared to conventional silicon wafers, SOI wafers are superior in that separation between elements, a reduction in parasitic capacitance between an element and a substrate, and a three-dimensional structure are all possible, and they are consequently used in high-speed, low power consumption LSI.

One method for producing an SOI wafer is a Smart Cut method in which hydrogen ions are implanted in the silicon wafer surface and then cleaving heat processing is performed with the result that cleaving can be performed using the ion implantation layer as a boundary. However, as a result of damage caused by the cleaving, the surface of the SOI wafer after the cleaving (i.e., the cleaving surface) ends up as a rough surface. In order to solve this problem, for example, the SOI wafer production method described in Patent Document 1 discloses smoothing processing that employs a vapor etching method.

In addition, for example, in the SOI wafer production method described in Patent Document 2 a technique is disclosed in which the surface of the wafer after cleaving undergoes oxidization processing and is then heat-processed in a reducing atmosphere containing hydrogen so that the surface is smoothed.

However, in the mechanical processing method described in Patent Document 1, the amount of polishing layer is non-uniform, and it is difficult to obtain a uniform film thickness distribution in the SOI layer. Because of this, the technique to smooth using high temperature heat processing such as is described in Patent Document 2 is used. However, in the method of manufacturing an SOI wafer described in Patent Document 2, if smoothing processing is performed using a hydrogen gas etching effect, then etching irregularities tend to occur. These etching irregularities cause the film thickness of the SOI layer to not be uniform. Moreover, because safety devices are required due to the use of hydrogen gas, the resulting equipment costs are high which creates problems from a financial standpoint.

[Patent Document 1] Japanese Unexamined Patent Application, First Publication, (JP-A) No. H11-102848

[Patent Document 2] Japanese Unexamined Patent Application, First Publication, (JP-A) No. 2000-124092

DISCLOSURE OF INVENTION

It is an object of this invention to provide a process for producing an SOI wafer that, in the production of an SOI wafer using a Smart Cut method, smoothes a cleaving surface after cleaving has been performed.

It is a further object of this invention to provide a process for producing an SOI wafer that provides a uniform film thickness for the SOI layer while making the SOI layer extremely thin.

This invention is a process for producing an SOI wafer in which: an ion implantation layer is formed via an insulating film on a wafer that is to be used as an active layer by implanting ions of hydrogen or a rare gas element, the wafer for the active layer is then bonded via an insulating film on a base wafer so as to form a bonded wafer, and the bonded wafer is then heat processed and is cleaved off with the ion implantation layer taken as a boundary, wherein after the SOI wafer has been formed by heat processing the bonded wafer and then cleaving it off taking the ion implantation layer as a boundary, oxidization processing is performed on the SOI wafer so that an oxide film having a predetermined thickness is formed on the surface of the SOI layer, this oxide film is then removed, and the SOI wafer is subsequently heat processed in an inert gas atmosphere.

In this process for producing an SOI wafer, an ion implantation layer is formed on a wafer that is used for the active layer using a process for forming an SOI wafer that is based on a Smart Cut method. Next, this active layer wafer is bonded via an insulating film onto a base wafer. As a result, a bonded wafer is produced in which two wafers are bonded together via an insulating film. Subsequently, by performing cleaving heat processing on this bonded wafer, cleaving can be achieved taking the ion implantation layer as a boundary. At this time, the roughness (root mean square; rms) of the surface of the SOI wafer after cleaving is 10 nm or less.

In addition, oxidization processing is performed on the SOI wafer in, for example, an oxidizing atmosphere. As a result, an oxide film having a predetermined thickness is formed on the surface of the SOI layer. The thickness of the oxide film at this time is 4000 Å. After this, the oxide film on the SOI wafer is removed by, for example, HF etching. As a result, the SOI layer of the SOI wafer is made more uniform than it was after the cleaving, and can also be made thinner.

Subsequent to this, heat processing is performed, for example, for approximately three hours or more at a temperature of 1100° C. or more in an argon gas atmosphere. The surface of the SOI wafer is re-crystallized (migration) by the argon gas.

As a result, the root mean square roughness (rms) (10 μm×10 μm) of the surface of the SOI wafer can be reduced to 0.1 nm or less.

When complete separation has been achieved in the cleaving heat processing, the oxidization processing can be performed in the same furnace consecutively with the cleaving heat processing. In addition, the smoothing heat processing can combine as bonding heat processing.

In the heat processing of an SOI wafer that is based on a Smart Cut method, there is cleaving heat processing in which cleaving is performed using the ion implantation layer as a boundary, and enhancement bonding heat processing in which the bonding between the active layer wafer and the base wafer after the cleaving is enhanced. After the cleaving heat processing, the SOI wafer is damaged by the cleaving and the surface thereof has been roughened. Therefore, after the cleaving processing, smoothing heat processing is performed by holding the SOI wafer in an inert gas atmosphere at a predetermined temperature. Subsequently, oxidization processing is performed on the SOI wafer in the oxidizing atmosphere. This oxide film is removed using, for example, HF solution. As a result, the SOI layer can be made thinner.

In the process for producing an SOI wafer of the present invention, in the above described heat processing in the inert gas atmosphere, it is preferable that the SOI wafer is held for approximately three hours or more at a temperature of 1100° C. or more in an argon gas atmosphere.

The temperature during the smoothing heat processing is 1100° C. or more. If the temperature is less than 1100° C., then it is not possible to re-crystallize the surface of the SOI wafer. Accordingly, the smoothing of the surface of the SOI wafer is insufficient.

In this process for producing an SOI wafer, the SOI wafer is heat processed by being held for approximately three hours at a temperature of 1100° C. or more. The argon gas has a smaller etching effect on the surface of the SOI wafer than does hydrogen gas. However, it does have the effect of making the surface of the SOI wafer that has become rough after the cleaving smooth as a result of the re-crystallization (i.e., of the migration). As a result, the surface of the SOI wafer is re-crystallized (i.e., migration occurs) and, in addition, the surface thereof is smoothed. If the temperature of the smoothing heat processing is 1100° C. or more, then the surface of the SOI wafer is sufficiently re-crystallized. Moreover, this heat processing can also perform the additional function of strengthening the adhesion.

In the process for producing an SOI wafer of the present invention, it is preferable for the oxidization processing to be performed at a temperature of 600° C. to 1000° C.

In a process for producing an SOI wafer that is based on Smart Cut technology, after cleaving has been performed using the ion implantation layer as a boundary, the SOI wafer undergoes oxidization processing in an oxidizing atmosphere. The temperature of the oxidization processing is in a range of 600° C. to 1000° C. and the oxidization processing time is not restricted.

In this process for producing an SOI wafer, the temperature during the oxidization processing is in a range of 600° C. to 1000° C., and is more preferably in a range of 600° C. to 800° C. If this temperature is less than 600° C., then it is difficult to form a satisfactory oxide film. If, on the other hand, the temperature exceeds 1000° C., then the roughness of the surface of the SOI wafer cannot be maintained and there is deterioration in the uniformity of the SOI layer.

Furthermore, in the process for producing an SOI wafer of the present invention, it is preferable for the oxide film to have a thickness of 4000 Å or more.

In this process for producing an SOI wafer, the thickness of the oxide film that is formed on the surface of the SOI wafer after cleaving is 4000 Å or more. If the thickness is less than 4000 Å, then it is not possible to sufficiently smooth the surface of the SOI layer even if the subsequent heat processing is performed in an argon gas atmosphere.

In this manner, according to the present invention, in a process for producing an SOI wafer using Smart Cut technology, if an SOI wafer after cleaving is heat processed in an oxidizing atmosphere, then an oxide film of 4000 Å or more is formed on the surface of the SOI layer. Thereafter, the oxide film is removed, for example, by HF etching. As a result, the SOI layer is made uniform and a reduction in the film thickness thereof is possible.

Next, smoothing heat processing is carried out while the SOI wafer is held in an argon gas inert atmosphere at a temperature of 1100° C. As a result, the surface of the SOI wafer (i.e., the cleaving surface) is re-crystallized (i.e., migration occurs) and this surface is smoothed.

As a result, according to the present invention, it is possible to reduce the root mean square roughness (rms) (10 μm×10μ) of the surface of this SOI layer to 0.1 nm or less.

In addition, when complete separation has been achieved in the cleaving heat processing, the oxidization processing can be performed in the same furnace consecutively with the cleaving heat processing.

BEST MODE FOR CARRYING OUT THE INVENTION

An embodiment of this invention will now be described with reference to FIGS. 1 and 2.

Here, a process for producing an SOI wafer in which an SOI layer is formed using a Smart Cut method is described.

Figure 1:
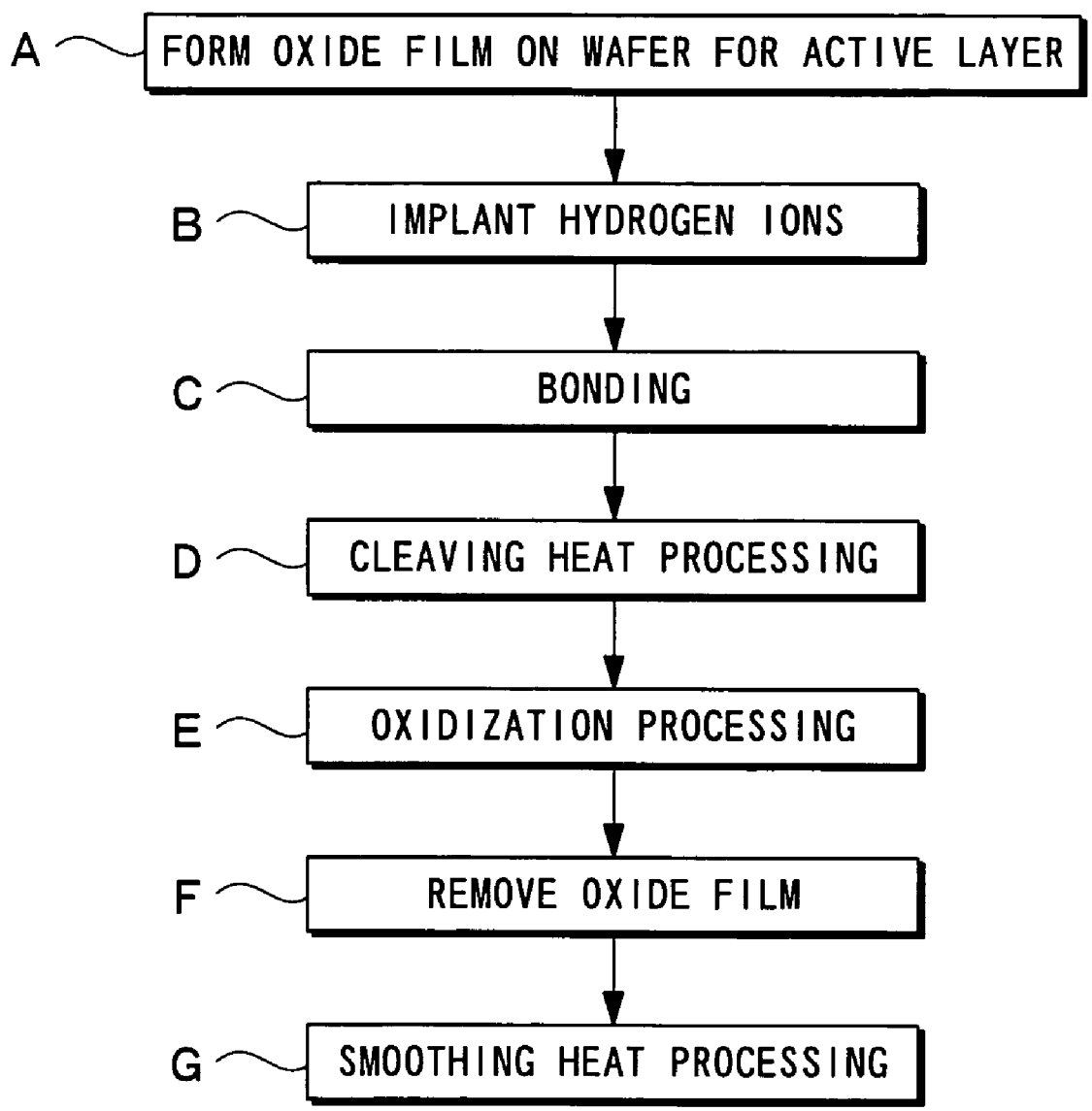
FIG. 1 is a process diagram showing a process for producing an SOI wafer according to an embodiment of this invention.

The production of an SOI wafer using a Smart Cut method according to the present embodiment is achieved using steps such as that shown in A to G in FIG. 1.

Firstly, two silicon wafers are prepared by taking slices from a silicon ingot that has been grown using a CZ method and doped with boron. One of these two silicon wafers is used for an active layer, while the other silicon wafer is used for base. Moreover, as is shown in step A in FIG. 1, an oxide film is formed on a surface of the silicon wafer that is used for the active layer. The oxide film is formed by placing the silicon wafer inside an oxidization furnace and then heating it at a predetermined temperature for a predetermined length of time. At this time, the thickness of the oxide film that is formed is 150 nm.

Next, the wafer for the active layer on which an oxide film has been formed is set inside a vacuum chamber of an ion implanter. Next, as is shown in step B, hydrogen ions in a dosage amount of 1.0 E16 atoms/cm$^2$ and at an acceleration voltage of 50 keV are implanted via the oxide film into the surface of the wafer for the active layer. The hydrogen ions are implanted to a position located a predetermined depth from the surface of the wafer for the active layer resulting in an ion implantation layer being formed at a position located at a predetermined depth (i.e., in a range located at a predetermined depth in the silicon substrate) in the wafer for the active layer.

Next, as is shown in step C, the active layer wafer that has been implanted with hydrogen ions is bonded to the base wafer with the surface that was implanted with the ions (i.e., the oxide film surface) used as the adhesion surface. As a result, a bonded wafer is formed in which an insulating film (i.e., the oxide film) is interposed at the adhesion interface.

As is shown in step D, the bonded wafer then undergoes heat processing in a nitrogen gas atmosphere at approximately 500° C. As a result, a hydrogen gas bubble is formed in the ion implantation layer of the bonded wafer, and a portion of the active layer wafer (i.e., a portion of the bonded wafer) is cleaved off with the ion implantation layer where the bubble is formed forming a boundary. Namely, the bonded wafer is separated into an SOI wafer in which an SOI layer (i.e., a portion of the active layer wafer) is stacked via an oxide film on a base wafer, and the remaining active layer wafer. The root mean square roughness (rms) (10 µm×10 µm) of the surface of the SOI wafer at this time is 10 nm or less.

The process thus far is the same as the process used in an SOI wafer production method that is based on a typical Smart Cut method.

Figure 2:
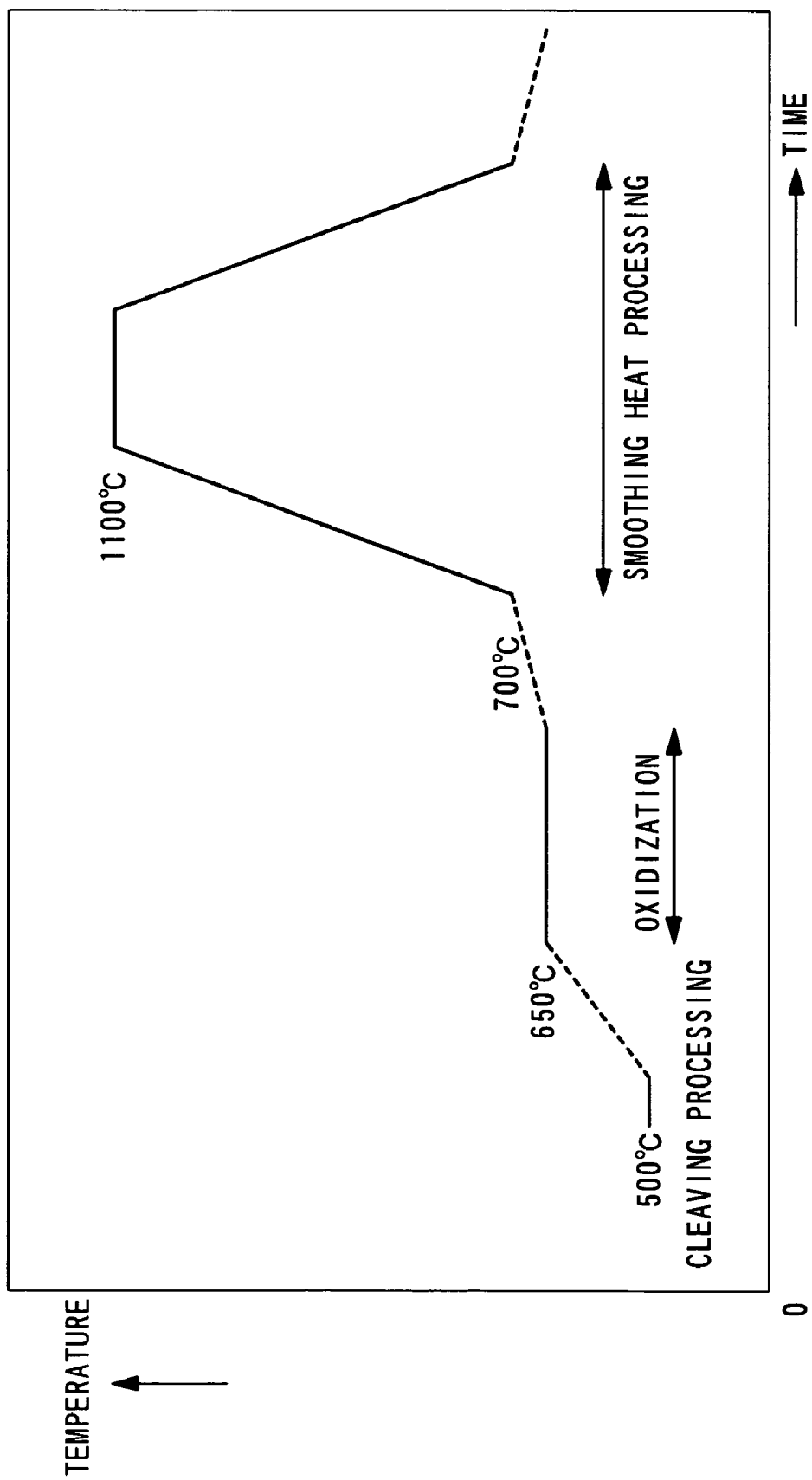
FIG. 2 is a graph showing a relationship between a heat processing temperature and time from cleaving heat processing to smoothing heat processing in a process for producing an SOI wafer according to an embodiment of this invention.

Next, as is shown in step E in FIG. 1 and in FIG. 2, wet oxidization processing is then performed for one hour on the SOI wafer at a temperature of 650° C. in an oxidizing atmosphere. As a result, an oxide film having a predetermined thickness is formed on the surface of the SOI layer.

Next, as is shown in step F, this oxide film is removed by, for example, HF etching. This makes the thickness of the SOI layer uniform and also makes it thinner.

The above described series of steps (i.e., the oxidization processing and the HF etching) can be performed a plurality of times. This makes it possible to make the SOI layer even thinner while maintaining the smoothed roughness. Namely, if there is a large machining allowance in the SOI layer, then after the oxidization processing has been performed so as to form the oxide film, the SOI layer can be made extremely thin by repeating the step to remove the oxide film by, for example, HF etching.

The reason why the wet oxidization processing is performed is because, if oxidization processing is performed in a dry oxidization atmosphere, then the oxidization rate is slow, and an extended period of heat processing is required. Moreover, it is also effective if hydrogen gas is added or if a gas type having a high oxidization rate such as HCl oxide is used.

Furthermore, oxidization processing is also required in low temperature areas where the formation of the oxide film is anisotropic. The temperature of the oxidizing atmosphere at this time is within a range of 600° C. to 1000° C., and more preferably, within a range of 600° C. to 800° C.

Next, as is shown in step G, smoothing heat processing is performed on the SOI wafer after the cleaving heat processing. This smoothing heat processing involves holding the SOI wafer for approximately three hours in an argon gas atmosphere at a temperature of 1100° C. or more.

It has been confirmed that the root mean square roughness (rms) (10 µm×10 µm) of an SOI wafer that has been created using the steps A to G shown in FIG. 1 is improved to 0.06 nm. In contrast, the root mean square roughness (rms) (10 µm×10 µm) of an SOI wafer that was created without the oxidization processing shown in step E and the HF dipping shown in step F being performed from among the above described steps A to G was only improved to 0.2 nm.

The thickness of the oxide film will now be considered. When the hydrogen ion implantation conditions are, for example, those described above, the thickness of SOI layer after cleaving is approximately 4000 Å. A 4000 Å oxide film is formed on this SOI wafer and the thickness of the SOI layer after this has been removed is 2000 Å. Accordingly, the oxide film (i.e., the BOX layer) directly below the SOI layer is not reached. However, if the acceleration voltage of the hydrogen ions is low, then the thickness of the SOI layer after the cleaving is too thin and the oxide film reaches the BOX layer. Accordingly, the thickness of the SOI layer immediately after the cleaving must be 2000 Å.

The final thickness of the SOI layer is generally 500 Å to 1000 Å. Accordingly, in consideration of the conditions of the oxidization processing and the smoothing heat processing, the thickness of the SOI layer immediately after the cleaving is preferably 3000 Å to 4000 Å.

If the temperature of the smoothing heat processing is 1200° C. or more, there is a possibility that slip dislocation will occur. Accordingly, a temperature of 1100° C. to 1150° C. is preferable. In consideration of throughput, it is also preferable that the heat processing time is approximately three hours.

Next, the results of experiments that were performed while altering the respective conditions for the above described oxidization processing and smoothing heat processing are shown.

The smoothing heat processing temperature for an SOI wafer that was prepared using the above described steps A to D was held to 1050° C. to 1300° C. while the time was gradually changed from one hour to four hours. The thickness of the oxide film was also changed in stages from 3000 Å to 5000 Å. A known method was used to evaluate the root mean square roughness (rms) (10 µm×10 µm) of the surface of the SOI layer of each of these SOI wafers. The evaluation results are shown in Table 1 below.

TABLE 1

| Temperature and time | Oxidization film (Å) | | |
| --- | --- | --- | --- |
| | 3000 | 4000 | 5000 |
| 1050° C. × 1 hr | X | X | X |
| 1050° C. × 2 hr | X | X | X |
| 1050° C. × 3 hr | X | X | X |
| 1050° C. × 4 hr | X | X | X |
| 1100° C. × 1 hr | X | X | X |
| 1100° C. × 2 hr | X | X | X |
| 1100° C. × 3 hr | X | ○ | ○ |
| 1100° C. × 4 hr | X | ○ | ○ |
| 1200° C. × 1 hr | X | ○ | ○ |
| 1200° C. × 2 hr | X | ○ | ○ |
| 1200° C. × 3 hr | X | ○ | ○ |
| 1200° C. × 4 hr | X | ○ | ○ | wherein,
○: ≦0.1 nm (10 µm × 10 µm, rms)
X: >0.1 nm (10 µm × 10 µm, rms)

From the above experiment results, the following was confirmed. Namely, when a cleaved SOI wafer first undergoes oxidization processing, then has this oxide film removed, and then undergoes smoothing heat processing by being held for approximately three hours or more in an argon gas atmosphere at a temperature of 1100° C., the root mean square roughness (rms) (10 µm×10 µm) of the surface of this SOI layer was able to be reduced to 0.1 nm or less.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

INDUSTRIAL APPLICABILITY

According to the method for producing an SOI wafer of the present invention, it is possible when producing an SOI wafer using a Smart Cut method, to smooth a wafer cleaving surface after cleaving has been performed and to provide a uniform film thickness for the SOI layer while making the SOI layer extremely thin.

The invention claimed is:

1. A process for producing an SOI wafer in which an ion implantation layer is formed via an insulating film on a wafer that is to be used as an active layer by implanting ions of hydrogen or a rare gas element, the wafer for the active layer is then bonded via an insulating film on a base wafer so as to form a bonded wafer, and the bonded wafer is then heat processed and is cleaved with the ion implantation layer taken as a boundary, wherein after the SOI wafer has been formed by heat processing the bonded wafer and then cleaving it off taking the ion implantation layer as a boundary, oxidization processing is performed on the SOI wafer so that an oxide film having a predetermined thickness is formed on the surface of the SOI layer, this oxide film is then removed, and the SOI wafer is subsequently heat treated in an inert gas atmosphere.

2. The process for producing an SOI wafer according to claim 1, wherein, in the heat processing in the inert gas atmosphere, the SOI wafer is held for approximately three hours or more at a temperature of 1100° C. or more in an argon gas atmosphere.

3. The process for producing an SOI wafer according to claim 1, wherein the oxidization processing is performed at a temperature of 600° C. to 1000° C.

4. The process for producing an SOI wafer according to claim 1, wherein the oxide film has a thickness of 4000°.

* * * * *